(12) United States Patent
Nowak

(10) Patent No.: US 8,129,773 B2
(45) Date of Patent: *Mar. 6, 2012

(54) FIN-TYPE FIELD EFFECT TRANSISTOR

(75) Inventor: Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 214 days.

This patent is subject to a terminal disclaimer.

(21) Appl. No.: 11/955,579

(22) Filed: Dec. 13, 2007

(65) Prior Publication Data

US 2008/0087968 A1 Apr. 17, 2008

Related U.S. Application Data

(63) Continuation of application No. 11/161,442, filed on Aug. 3, 2005, now Pat. No. 7,348,642.

(51) Int. Cl.
*H01L 29/06* (2006.01)
(52) U.S. Cl. .. 257/308; 257/288; 257/401; 257/E29.268
(58) Field of Classification Search .................. 257/282, 257/308, 288, 401, E29.268
See application file for complete search history.

(56) References Cited

U.S. PATENT DOCUMENTS

| 4,907,041 | A | 3/1990 | Huang |
| 5,399,896 | A | 3/1995 | Oku |
| 5,985,724 | A | 11/1999 | Kadosh et al. |
| 6,413,802 | B1 | 7/2002 | Hu et al. |
| 6,534,787 | B1 | 3/2003 | Hsu |
| 6,706,571 | B1 | 3/2004 | Yu et al. |
| 6,740,914 | B2 | 5/2004 | Masleid |
| 6,800,885 | B1 | 10/2004 | An et al. |
| 6,992,358 | B2 | 1/2006 | Hieda et al. |
| 7,129,550 | B2 * | 10/2006 | Fujiwara et al. ............... 257/401 |
| 7,176,092 | B2 * | 2/2007 | Yeo et al. ...................... 438/283 |

(Continued)

FOREIGN PATENT DOCUMENTS

EP 1693898 A1 8/2006

(Continued)

OTHER PUBLICATIONS

Lindert et al., "Sub-60-nm Quasi-Planar FinFETs Fabricated using a Simplified Process," IEEE, vol. 22, No. 10, Oct. 2001, pp. 487-489.

(Continued)

*Primary Examiner* — Kenneth Parker
*Assistant Examiner* — Jose R Diaz
(74) *Attorney, Agent, or Firm* — Gibb I.P. Law Firm, LLC; Richard M. Kotulak, Esq.

(57) ABSTRACT

Disclosed herein are improved fin-type field effect transistor (FinFET) structures and the associated methods of manufacturing the structures. In one embodiment FinFET drive current is optimized by configuring the FinFET asymmetrically to decrease fin resistance between the gate and the source region and to decrease capacitance between the gate and the drain region. In another embodiment device destruction at high voltages is prevented by ballasting the FinFET. Specifically, resistance is optimized in the fin between the gate and both the source and drain regions (e.g., by increasing fin length, by blocking source/drain implant from the fin, and by blocking silicide formation on the top surface of the fin) so that the FinFET is operable at a predetermined maximum voltage.

13 Claims, 13 Drawing Sheets

U.S. PATENT DOCUMENTS

| | | |
|---|---|---|
| 7,456,476 B2 * | 11/2008 | Hareland et al. ............ 257/349 |
| 2001/0040273 A1 | 11/2001 | Hueting et al. |
| 2002/0036328 A1 | 3/2002 | Richards, Jr. et al. |
| 2002/0171113 A1 | 11/2002 | Murakami et al. |
| 2003/0102518 A1 | 6/2003 | Fried et al. |
| 2003/0197194 A1 | 10/2003 | Fried et al. |
| 2004/0031979 A1 | 2/2004 | Lochtefeld et al. |
| 2004/0099885 A1 | 5/2004 | Yeo et al. |
| 2004/0145000 A1 | 7/2004 | An et al. |
| 2005/0051825 A1 | 3/2005 | Fujiwara et al. |
| 2005/0094434 A1 | 5/2005 | Watanabe et al. |
| 2005/0205944 A1 | 9/2005 | Clark, Jr. et al. |
| 2005/0224800 A1 | 10/2005 | Lindert et al. |
| 2005/0285189 A1 | 12/2005 | Shibib et al. |
| 2006/0273409 A1 | 12/2006 | Lee et al. |
| 2008/0093667 A1 * | 4/2008 | Shibib et al. ................ 257/341 |

FOREIGN PATENT DOCUMENTS

| | | |
|---|---|---|
| JP | 62-026865 | 2/1987 |
| JP | 62-132366 | 6/1987 |
| JP | 2003298063 A | 10/2003 |

OTHER PUBLICATIONS

EP06788172, Supplementary European Search Report, Jan. 20, 2011, 4 pages.

Nowak et al., U.S. Appl. No. 11/972,412, Office Action Communication, Jan. 26, 2011, 5 pages.

Nowak et al., U.S. Appl. No. 11/972,412, BUR920050040US3, Notice of Allowance, Sep. 26, 2011, 7 pages.

* cited by examiner

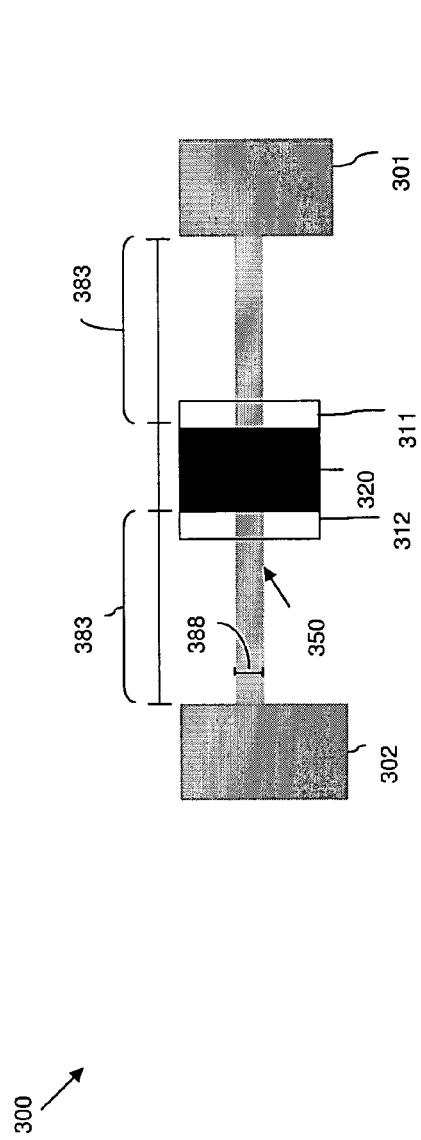
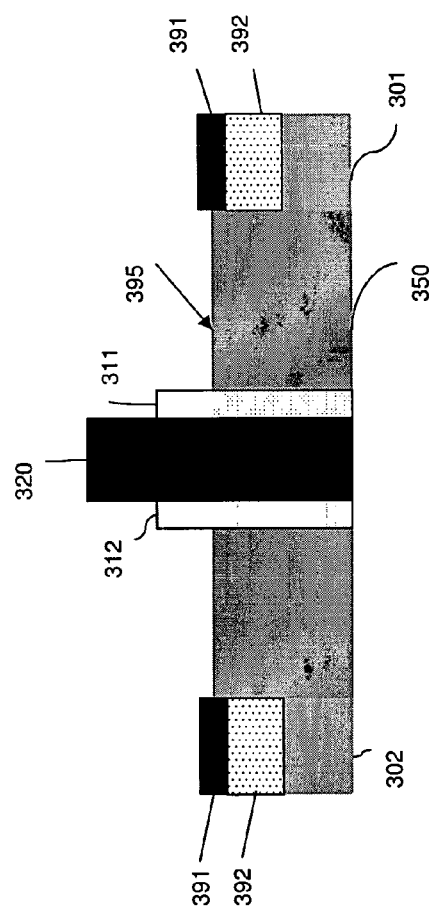

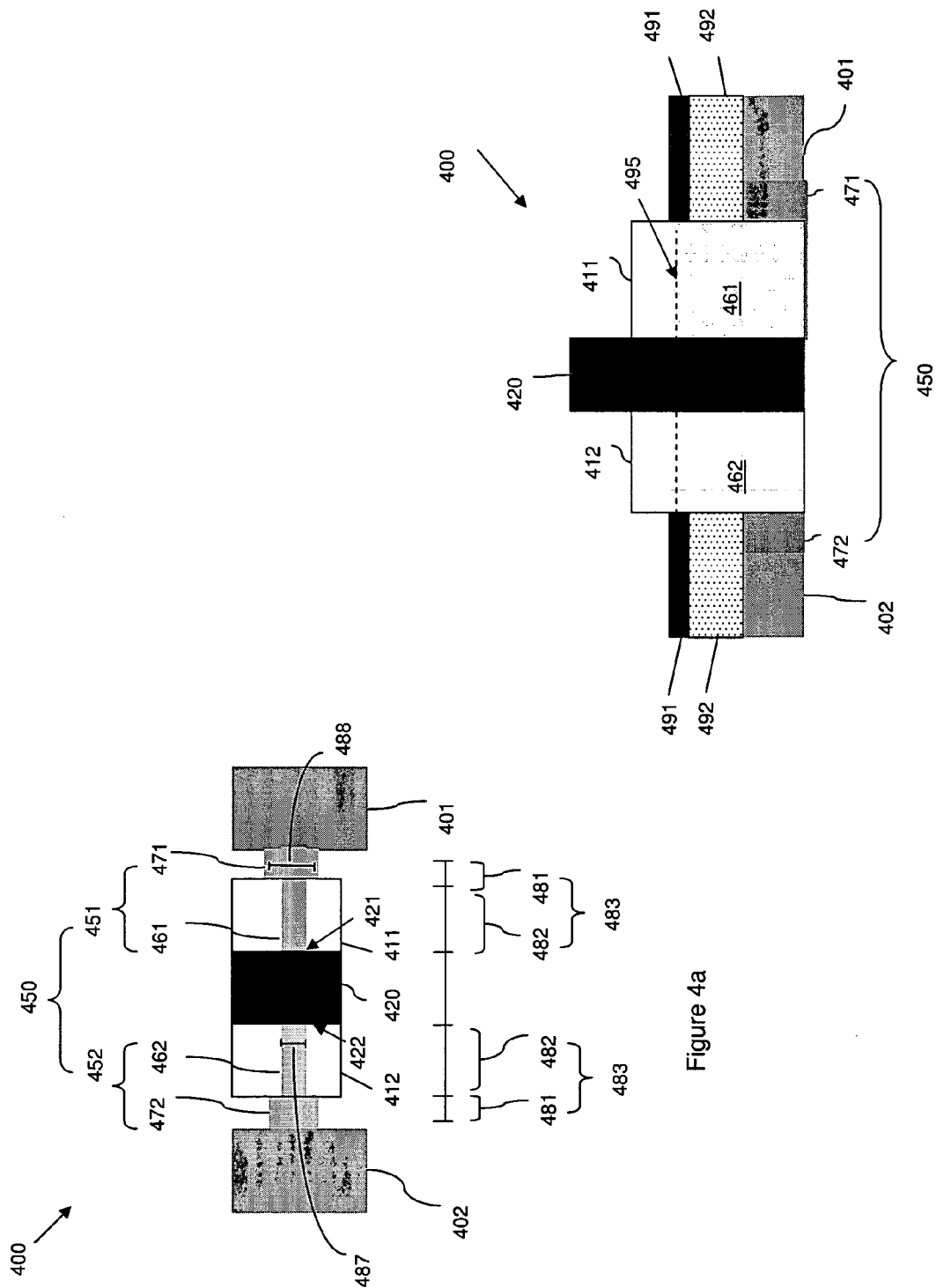

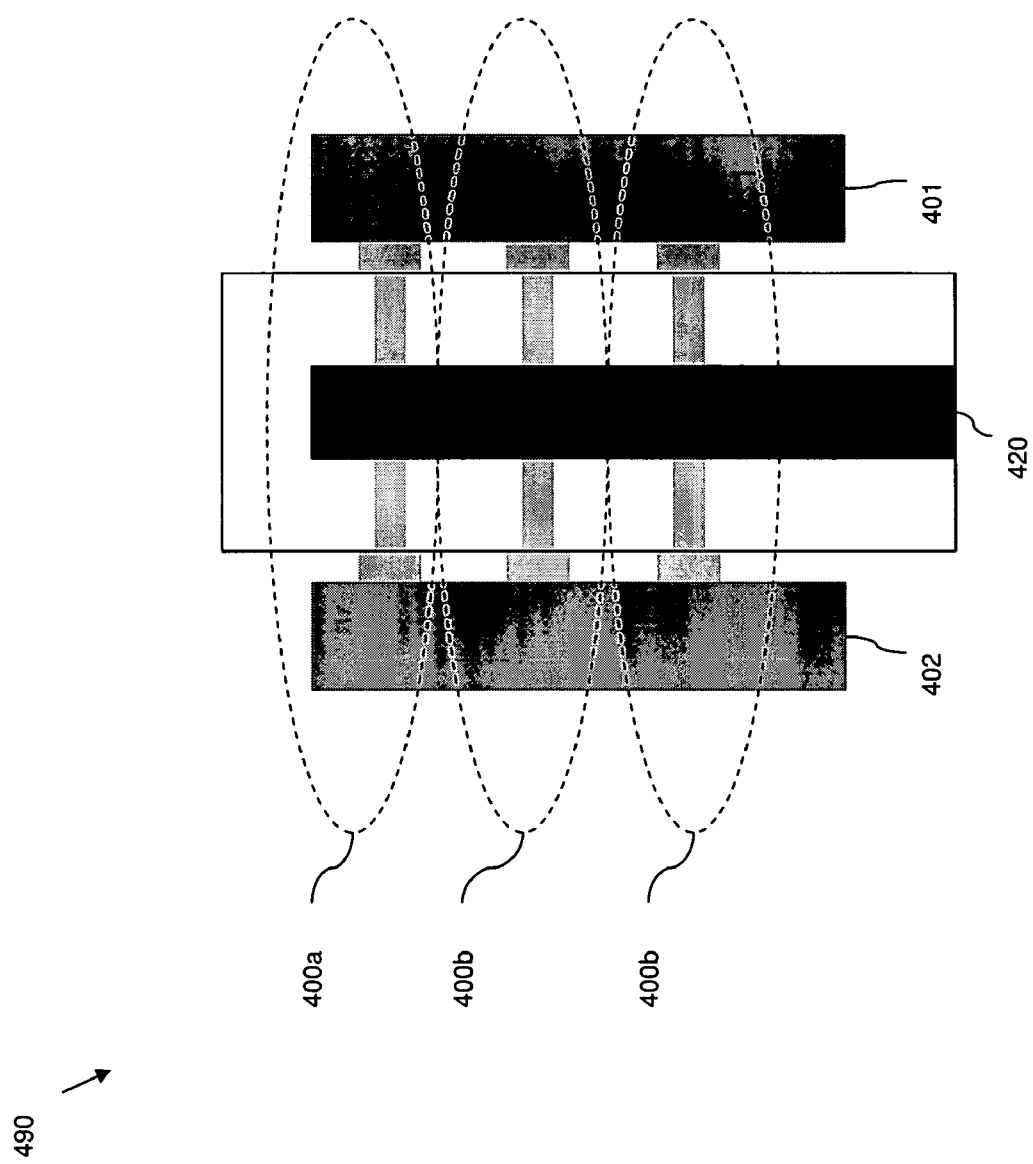

FIN-TYPE FIELD EFFECT TRANSISTOR

CROSS-REFERENCE TO RELATED APPLICATIONS

This application is a continuation of U.S. application Ser. No. 11/161,442 filed Aug. 3, 2005, the complete disclosure of which, in its entirety, is herein incorporated by reference.

BACKGROUND OF THE INVENTION

1. Field of the Invention

The invention generally relates to fin-type field effect transistors (FinFET), and more particularly, to an improved FinFET structure in which resistance is increased between the gate and either the drain region or both the source and the drain regions in order to lower Miller effect capacitance between the gate and the drain region and to ballast the FinFET, respectively.

2. Description of the Related Art

As transistor design is improved and evolves, the number of different types of transistors continues to increase. A fin-type field effect transistor (FinFET) is a type of transistor that has a fin, containing a channel region and source and drain regions. A double-gated FinFET is a FinFET with first and second gate conductors on either sidewall of the fin. The gate conductors cover the channel region of the fin, whereas the source and drain regions of the fin extend beyond the coverage of the gate conductors. FinFETs are discussed at length in U.S. Pat. No. 6,413,802 to Hu et al. (hereinafter "Hu"), which is incorporated herein by reference. Due to the structure of the FinFET, there is an intrinsic trade-off between series resistance and gate-source/drain capacitance in FinFETs. For example, the width of a fin can be expanded as the fin exits the gate in order to lower series resistance and, specifically, to lower resistance between the source and the gate which can cause a feedback that can significantly lower device drive for digital circuits. However, widening the fin between the gate and the drain region not only decreases the resistance between the gate and the drain, it also increases capacitance. While drain resistance has little effect on the device drive for digital circuits, capacitance between the gate and drain can often have up to three times the effect on circuit delay of capacitance between gate and source due to the Miller effect.

In a related problem, at very high voltages a FinFET can enter a mode known as snap-back in which thermal run-away in the hottest region of a transistor channel can destroy the FET. In a FinFET comprising a plurality of fins, if one fin enters into a breakdown condition, thermal run-away, can occur, which results in that fin conducting all additional current and ultimately resulting in the destruction of the FinFET. The present invention addresses these issues by providing improved FinFET structures and the associated methods of making these structures in which fin resistance is increased between the gate and either the drain region alone or between the gate and both the source and the drain regions in order to lower Miller effect capacitance between the gate and the drain region and to ballast the FinFET, respectively.

SUMMARY OF THE INVENTION

The present invention provides embodiments of an improved FinFET structure and the associated methods of making the embodiments of the structure. In one embodiment FinFET drive current is optimized by configuring the FinFET asymmetrically to decrease fin resistance between the gate and the source region and to decrease capacitance between the gate and the drain region. In another embodiment device destruction at high voltages is prevented by ballasting the FinFET. Specifically, resistance is increased in the fin between the gate and both the source region and the drain region so that the FinFET is operable at a predetermined maximum voltage. When multiple ballasted FinFETs of the invention are formed in a series, this ballasting prevents a premature runaway in one fin, causing destruction of the FinFET.

More particularly, one embodiment of the FinFET structure of the invention comprises parallel semiconductor planes on a substrate that form a source region and a drain region. Another semiconductor plane (i.e., fin) extends from the source region to the drain region. A gate is positioned on the fin between the source and drain regions. Specifically, a gate dielectric layer is formed on the opposing sidewalls of the fin between the source and drain regions. A gate conductor is form on the gate dielectric layer. The FinFET structure is asymmetrically configured such that a first resistance of the semiconductor fin between the source region and the gate conductor is less than a second resistance of the semiconductor fin between the gate conductor and the drain region and such that a first capacitance between the source region and the gate conductor is greater than a second capacitance between the gate conductor and the drain region. For example, the gate conductor may be positioned on the fin closer to the source region than the drain region. Positioning the gate conductor closer to the source region ensures that the first resistance between the gate conductor and the source region is less than the second resistance between the gate conductor and the drain region. Positioning the gate conductor farther away from the drain region decreases the capacitance between the gate and the drain region. Alternatively, the gate can be positioned equidistance from the source and drain regions and asymmetry can be achieved through the dimensions of the fin on either side of the gate conductor. For example, the fin can be configured with a first portion between the gate conductor and the source region and a second portion between the gate conductor and the drain region. Both the first portion and second portion can comprise inner sections adjacent to the gate conductor and outer section. The inner sections can be narrower than the outer sections (i.e., the inner sections can have a first width that is less than the second width of the outer sections). Decreased capacitance between the gate and the drain region as well as decreased resistance of the fin between the gate and the source region are provided if the inner section of the second portion of the fin between the gate and the drain region is longer than the inner section of the first portion of the fin between the gate and the source region. Specifically, optimal resistance and capacitance can be achieved if the inner section of the first portion has a first length that is approximately equal to the first width (i.e., width of the inner sections) and if the inner section of the second portion has a second length that is greater than approximately three times the first width.

Another embodiment of the FinFET structure of the invention also comprises parallel semiconductor planes on a substrate that form a source and drain regions. Another semiconductor plane (i.e., fin) extends from the source region to the drain region. A gate is positioned on the fin equidistance between the source and drain regions. Specifically, a gate dielectric layer is formed on the opposing sidewalls of the fin between the source and drain regions. A gate conductor is formed on the gate dielectric layer. The FinFET structure of this embodiment is ballasted to prevent destruction at high voltages. For example, if a length of the semiconductor fin between the gate conductor and the source/drain regions is greater than approximately three to five times a width of the semiconductor fin, enough resistance can be provided within the semiconductor fin so that said transistor is operable at a predetermined maximum voltage. Additional resistance for ballasting can be provided if the semiconductor fin is configured with a lesser concentration of source/drain dopants (e.g., n-type dopants or p-type dopants) than in the source/drain regions and without a silicide layer on the top surface of the fin. Alternatively, the semiconductor fin can comprise a first portion between the source region and the gate conductor and second portion between the gate conductor and the drain region. Both the first and second portions comprise inner sections having the same width (i.e., first width) and the same length (i.e., first length), adjacent the gate conductor. The first and second portions can also each comprise outer sections between the inner sections and the source/drain regions. Ballasting can be achieved if the length of the inner sections (i.e., the first length) is greater than approximately three to five times the same width of the inner sections (i.e., first width). Specifically, the length of the inner sections provides resistance within the fin so that the transistor is operable at a predetermined maximum voltage. Additional resistance for ballasting can be provided if the inner sections have a lesser concentration of source/drain dopants (e.g., n-type dopants or p-type dopants) than the source/and drain regions and if they are devoid of a silicide layer adjacent their corresponding top surfaces.

An embodiment of a method of manufacturing a fin-type field effect transistor, and particularly, an asymmetric FinFET, comprises forming the source region, the drain region and the semiconductor fin that extends from the source region to the drain region. The source and drain regions are formed as parallel semiconductor planes on a substrate. Another semiconductor plane extending between the source region and the drain region is used to form the fin. Then, a gate is formed adjacent to the semiconductor fin between the source region and the drain region, e.g., by forming a gate dielectric layer on the opposing sidewalls of the fin and forming a gate conductor on the gate dielectric layer. The transistor, and particularly, the semiconductor fin and the gate conductor are formed asymmetrically such that a first resistance of the semiconductor fin between the source region and the gate conductor is less than a second resistance of the semiconductor fin between the gate conductor and the drain region and such that a first capacitance between the source region and the gate conductor is greater than a second capacitance between the gate conductor and the drain region. For example, the gate conductor can be formed adjacent to the semiconductor fin such that the gate conductor is closer to the source region than the drain region, thereby, decreasing the resistance in the fin between the source region and the gate conductor and decreasing the capacitance between the gate conductor and the drain region.

Alternatively, the gate conductor can be formed adjacent the semiconductor fin equidistance between the source region and the drain region. The dimensions of a first portion of the fin between the gate conductor and the source region and the dimensions of a second portion of the fin between the gate conductor and drain region are adjusted to vary the first and second resistances, respectively. The first and second portions are each formed with an inner section adjacent the gate conductor and a wider outer section between the gate conductor and source or drain regions, respectively. The inner sections each have the same width (i.e., first width) and the outer sections each have the same width (i.e., second width). Asymmetry can be achieved if the inner section of the second portion between the gate conductor and the drain region is longer than the inner section of the first portion. Thus, the resistance in the fin between the source region and the gate conductor is decreased and the capacitance between the gate conductor and the drain region is also decreased. Optimal asymmetry can be achieved if the inner section of the first portion is formed with a length (i.e., first length) that is approximately equal to the width of the inner sections and the inner section of the second portion is formed with a length (i.e., second length) that is greater than approximately three to five times the first width. Once the source/drain regions, fin, and gate are formed additional processing steps may be performed to complete FinFET.

In order to adjust the dimensions of the first and second portions of the fin, as described above, after forming the gate conductor, a first spacer is formed over the first portion of the fin (e.g., on the top surface and opposing sidewalls of the fin) immediately adjacent to the gate conductor and a second spacer is similarly formed on the second portion side of the gate conductor. The first and second spacers can initially be formed with a same thickness. This thickness can be greater than approximately three to five times the first width (i.e., the width of the narrow sections of the fin) and should be such that a first exposed section of the first portion of the fin remains between the first spacer and the source region and a second exposed section of the second portion of the fin remains between the second spacer and the drain region. After the spacers are formed, the size (i.e., thickness) of the first spacer is reduced. One technique for reducing the thickness of the first spacer comprises masking the second spacer and then isotropically etching the first spacer. The etching process etches back not only the top surface of the first spacer but also the exposed sidewall of the first spacer, thus, reducing the spacer thickness. Another technique for reducing the thickness of the first spacer comprises implanting an inert species (e.g., silicon, argon, xenon, etc) from a less than 90 degree angle towards the first spacer such that the second spacer is blocked by the gate conductor and the first spacer, thereby, receives a greater concentration of the inert material to enhance the etch rate of the first spacer. Then, an etching process is performed such that first spacer with the greater concentration of the inert species is etched at a faster rate than the second spacer. Again, the etching process etches back not only the top surface of the spacer but also the exposed sidewall of the first spacer, thus, reducing the spacer thickness. Once the thickness of the first spacer is reduced (e.g., such that it is equal to approximately the width of the fin (i.e., first width)), additional semiconductor material is formed on the first and second exposed sections to form the first and second outer sections, respectively. Thus, the inner sections are those sections of the fin that remain under the first and second spacers, respectively.

An embodiment of the method of manufacturing a fin-type field effect transistor, and particularly, a ballasted FinFET, comprises forming the source region, the drain region and the semiconductor fin that extends from the source region to the drain region. The source and drain regions are formed as parallel semiconductor planes on a substrate. Another semiconductor plane extending between the source region and the drain region is used to form the fin. Then, a gate is formed adjacent to the semiconductor fin equidistance between the source region and the drain region, e.g., by forming a gate dielectric layer on the opposing sidewalls of the fin and forming a gate conductor on the gate dielectric layer. Ballasting can be achieved by forming the gate such that the length of the fin between either the gate conductor and the source region or the gate conductor and the drain region is greater than approximately three times a width of the semiconductor fin.

This length provides added resistance within the semiconductor fin so that the transistor is operable at a predetermined maximum voltage. Once the source/drain regions, fin, and gate are formed additional processing steps may be performed to complete FinFET. Additional resistance for ballasting can be provided by forming the semiconductor fin with a lower concentration of source/drain dopants than in the source/drain regions (e.g., by blocking implantation of an N+region or P+region into the fin) and by forming the fin without a silicide layer on the top surface (e.g., by blocking silicide formation on the top surface of the fin).

Alternatively, ballasting can be achieved by forming the gate conductor equidistance between the source/drain regions and by adjusting dimensions of the fin on either side of the gate conductor to optimize resistance so that the transistor is operable at a predetermined maximum voltage. For example, outer sections of the fin adjacent to the source/drain regions can be formed wider than inner sections adjacent to the gate conductor. The inner sections can be formed such that their length is greater than approximately three times their width. To form the inner and outer sections spacers are formed over the fin (e.g., on the top surface and opposing sidewalls of the fin) immediately adjacent to both sides of the gate conductor. The spacers can be formed with a thickness that is greater than approximately three to five times the width of the fin as originally formed (i.e., the width of the inner sections of the fin) and should be such that exposed sections of the fin remain between the spacers and the source/drain regions. Once the spacers are formed, additional semiconductor material is formed on the exposed sections of the fin to form the wider outer sections. Thus, the narrower inner sections are those sections of the fin that remain under the spacers. Again, once the source/drain regions, fin, and gate are formed additional processing steps may be performed to complete FinFET. Additional resistance for ballasting can be achieved if the inner sections are formed without a silicide layer on their corresponding top surfaces and if the concentration of source/drain dopants (e.g., n-type dopants or p-type dopants) is greater in the source/drain regions than in the inner sections of the fin.

These, and other, aspects and objects of the present invention will be better appreciated and understood when considered in conjunction with the following description and the accompanying drawings. It should be understood, however, that the following description, while indicating embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which:

FIG. 3a is a schematic diagram of the FinFET 300 of the invention;

FIG. 3b is a side view schematic diagram of the FinFET 300;

FIG. 4a is a schematic diagram of the FinFET 400 of the invention;

FIG. 4b is a side view schematic diagram of the FinFET 400;

FIG. 4c is a schematic diagram of a series of FinFETs 400;

DETAILED DESCRIPTION OF PREFERRED EMBODIMENTS OF THE INVENTION

Figure 1:
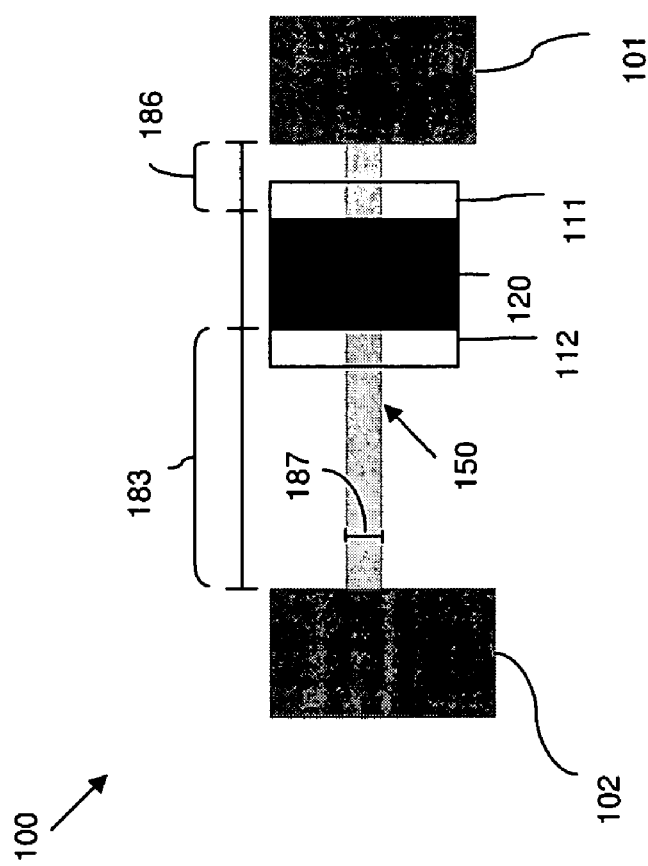
FIG. 1 is a schematic diagram of the FinFET 100 of the invention.

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

Disclosed herein are improved fin-type field effect transistor (FinFET) structures and the associated methods of manufacturing the structures. In one embodiment FinFET drive current is optimized by configuring the FinFET asymmetrically to decrease fin resistance between the gate and the source region and to decrease capacitance between the gate and the drain region. In another embodiment device destruction at high voltages is prevented by ballasting the FinFET. Specifically, resistance is optimized in the fin between the gate and both the source and drain regions (e.g., by increasing fin length, by blocking source/drain implant from the fin, and by blocking silicide formation on the top surface of the fin) so that the FinFET is operable at a predetermined maximum voltage. When multiple ballasted FinFETs of the invention are formed in a series, this ballasting can prevent a chain reaction that can cause destruction of all FinFETs in the series.

Figure 2:
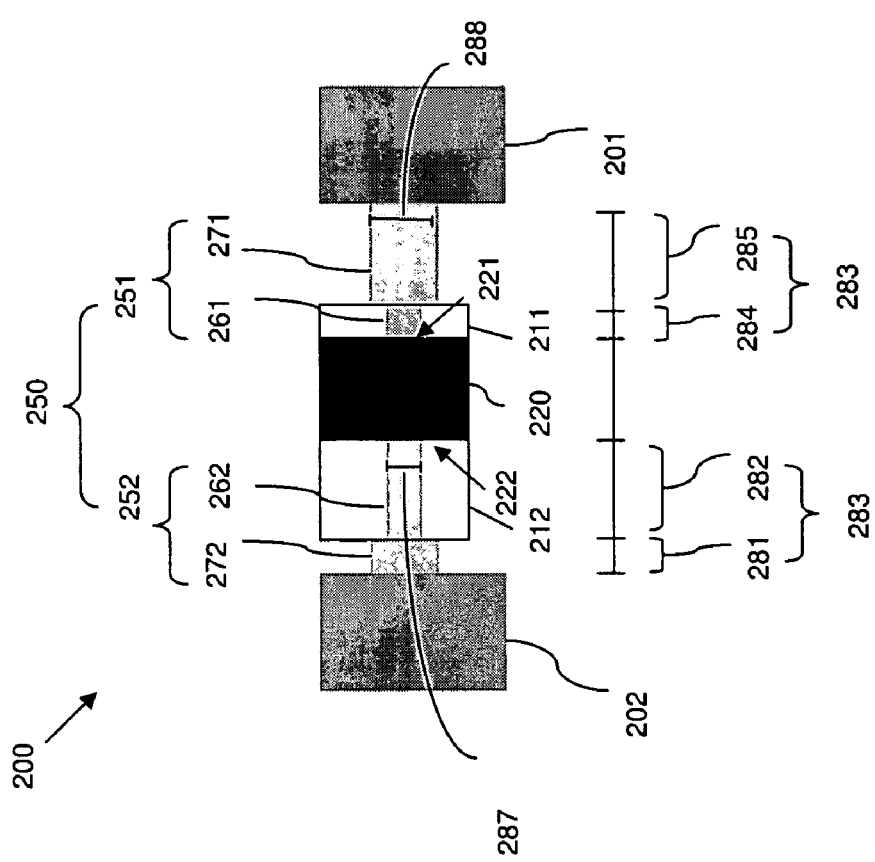
FIG. 2 is a schematic diagram of the FinFET 200 of the invention.

Referring to FIGS. 1 and 2, in one embodiment of the structure of the invention, the FinFETs 100, 200 are designed with asymmetry between the source 101, 201 and drain 102, 202 regions. For example, the gate and particularly, the gate conductor 120, 220 is placed closer to the point where the fin 150, 250 merges into a single source strap (see item 101 of FIG. 1) or increases in width (see item 271 of FIG. 2) between the gate conductor and source strap. By contrast the gate conductor 120, 220 is place further from the point where the fin increases in width (see item 272 of FIG. 2) between the gate conductor and drain strap or from where the fin merges into a single drain strap (see item 102 of FIG. 1). More particularly, referring to FIGS. 1 and 2, one embodiment of the FinFET structure (100, 200) of the invention comprises parallel semiconductor planes on a substrate that form a source region 101, 201 and a drain region 102, 202. Another semiconductor plane (i.e., a 3-40 nm wide fin 150, 250) extends from the source region 101, 201 to the drain region 102, 202. A gate is positioned on the fin 150, 250 between the source 101, 201 and drain regions 102, 202. Specifically, a gate dielectric layer is formed on the opposing sidewalls of the fin between the source and drain regions. A gate conductor 120, 220 is form on the gate dielectric layer. The FinFET structure 100, 200 is asymmetrically configured such that a first resistance of the semiconductor fin 150, 250 between the source region 101, 201 and the gate conductor 120, 220 is less than a second resistance of the semiconductor fin 150, 250 between the gate conductor 120, 220 and the drain region 102, 202 and such that a first capacitance between the source region 101, 201 and the gate conductor 120, 220 is greater than a second capacitance between the gate conductor 120, 220 and the drain region 102, 202.

For example, referring to FIG. 1, the gate conductor 120 may be positioned on the fin 150 closer to the source region 101 than the drain region 102. Positioning the gate conductor closer to the source region ensures that the first resistance between the gate conductor and the source region is less than the second resistance between the gate conductor and the drain region. Positioning the gate conductor farther away from the drain region decreases the capacitance between the gate and the drain region.

Alternatively, referring to FIG. 2, the gate conductor can be positioned equidistance 283, 286 from the source 201 and drain 202 regions. The fin 250 can be configured with a first portion 251 between the gate conductor 220 and the source region 201 and a second portion 252 between the gate conductor 220 and the drain region 202. Both the first portion 251 and second portion 252 can comprise inner sections 261, 262, respectively, adjacent the gate conductor 220 and outer sections 271, 272 adjacent the inner sections 261, 262 (i.e., between the inner section 261 and the source region 201 and between the inner section 262 and the drain region 202). The inner sections 261, 262 can have the same width (e.g., an approximately 3-40 nm first width 287). The outer sections 271, 272 can also have the same width (e.g., an approximately 9-200 nm second width 288) that is wider than the first width 287 of the inner sections 261, 262. Decreased capacitance between the gate conductor 220 and the drain region 202 as well as decreased resistance between the gate conductor 220 and the source region 201 are provided if the inner section 262 of the second portion 252 is longer than the inner section 261 of the first portion 251. Resistance is decreased between the gate conductor 220 and the source region 201 the closer the first wide section 271 is to the gate conductor 220. Specifically, optimal resistance and capacitance can be achieved if the inner section 261 has a first length 284 that is approximately equal to the first width 287 and if the inner section 262 has a second length 282 that is greater than approximately three times the first width 287.

Referring to FIGS. 3*a-c* and 4*a-c*, another embodiment of the FinFET structure 300, 400 of the invention comprises parallel semiconductor planes on a substrate that form a source region 301, 401 and a drain region 302, 402. Another semiconductor plane (i.e., a 3-40 nm wide fin 350, 450) extends from the source region 301, 401 to the drain region 302, 402. A gate (e.g., comprising a gate dielectric layer and gate conductor 320, 420) can be positioned on the fin 350, 450 equidistance 383, 483 between the source 301, 401 and drain 302, 402 regions. The structures 300, 400 can also comprise spacers 311-312, 411-412 formed over the fin 350, 450 on the opposing sidewalls of the gate conductor 320, 420. The FinFET structure 300, 400 of this embodiment is ballasted to prevent destruction at high voltages. As discussed above, at very high voltages FinFETs can enter a mode known as snapback in which destruction of the FET can result due to current run-away in the hottest region of a transistor channel. This can occur with parallel sets of FinFET having a plurality of fins in which the hottest fin enters thermal run-away, conducting all additional current and ultimately causing the destruction of the FinFETs. The structures 300, 400 of the invention provide a ballasted FinFET so that a maximum voltage/current that can be applied to a plurality of FinFETs in parallel (see items 390, 490 of FIGS. 3*c* and 4*c*, respectively) can be increased to a predetermined maximum.

Figure 3C:
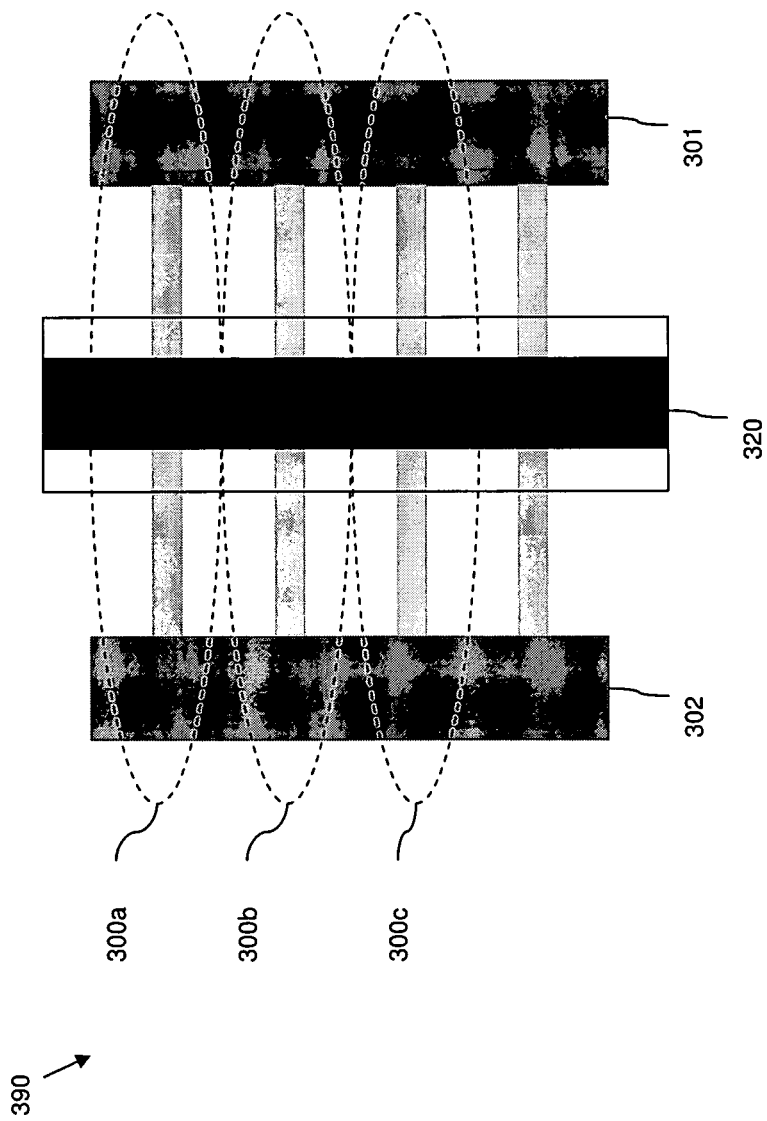
FIG. 3c is a schematic diagram of a series of FinFETs 300.

For example, referring to FIGS. 3*a-b*, equal lengths 383 of the semiconductor fin 350 between the gate conductor 320 and the source region 301 and the gate conductor 320 and the drain region 302, respectively, are greater than approximately three to five times a width 388 (e.g., 9-200 nm) of the semiconductor fin 350. This length 383 can provide enough resistance within the semiconductor fin 350 so that the transistor 300 is operable at a predetermined maximum voltage. Additional resistance for ballasting can be provided if the semiconductor fin 350 is configured with a lesser concentration of dopants in the semiconductor fin than in the source/drain regions 301, 302. Additional resistance can also be provided if the top surface 395 of the semiconductor fin is devoid of a silicide layer 391. For example, as illustrated in FIG. 3*b*, the source/drain regions 301, 302 can be implanted with an N+region 392 and topped with a silicide 391; however, during the manufacturing process silicide 391 and N+region 392 formation in the fin 350 can be blocked. Referring to FIG. 3*c*, if ballasted FinFETs 300*a-c* are formed in a parallel set 390, the ballasting of the individual FETs (300*a-c*) prevents the fin with lowest breakdown voltage from entering thermal runaway and conducting all of the excess current, and ultimately causing the destruction of all FinFETs 300*a-c* in the parallel set 390.

Alternatively, referring to FIGS. 4*a-b*, the semiconductor fin 450 can comprise a first portion 451 between the source region 401 and the gate conductor 420 and second portion 452 between the gate conductor 420 and the drain region 402. Both the first 451 and second 452 portions comprise inner sections 461, 462, having the same width, e.g., 3-40 nm (i.e., first width 487), and the same length, e.g., 9-200 nm (i.e., first length 482). The inner sections 461, 462 are positioned immediately adjacent the gate conductor 420. The first 451 and second 452 portions can also each comprise outer sections 471, 472 wide sections between the inner sections 461, 462 and the source/drain regions 401, 402. Ballasting can be achieved if the length of the inner sections (i.e., the first length 482) is greater than approximately three to five times their width (i.e., first width 487). Specifically, the length 482 of the inner sections 461, 462 narrow provides resistance within the fin 450 so that the transistor 400 is operable at a predetermined maximum voltage. Additional resistance for ballasting can be provided if the inner sections 461, 462 are configured a lesser concentration of source/drain dopants (i.e., p-type or n-type dopants) than the source/drain regions 401, 402 and if the top surfaces 495 of the inner sections 461, 462 are devoid of an adjacent silicide layer. For example, as illustrated in FIG. 4*b*, the source/drain regions 401, 402 as well as the outer sections 471, 472 can be implanted with an N+region 492 and topped with a silicide 491; however, during the manufacturing process silicide 491 and N+region 492 formation in the inner sections 461, 462 is blocked by spacers 411, 412. Referring to FIG. 4c, if ballasted FinFETs 400a-c are formed in a parallel set 490, the ballasting of the individual FETs (400a-c) prevents the fin with lowest breakdown voltage from entering thermal run-away and conducting all of the excess current, and ultimately causing the destruction of all FinFETs 400a-c in the parallel set 490.

Figure 5:
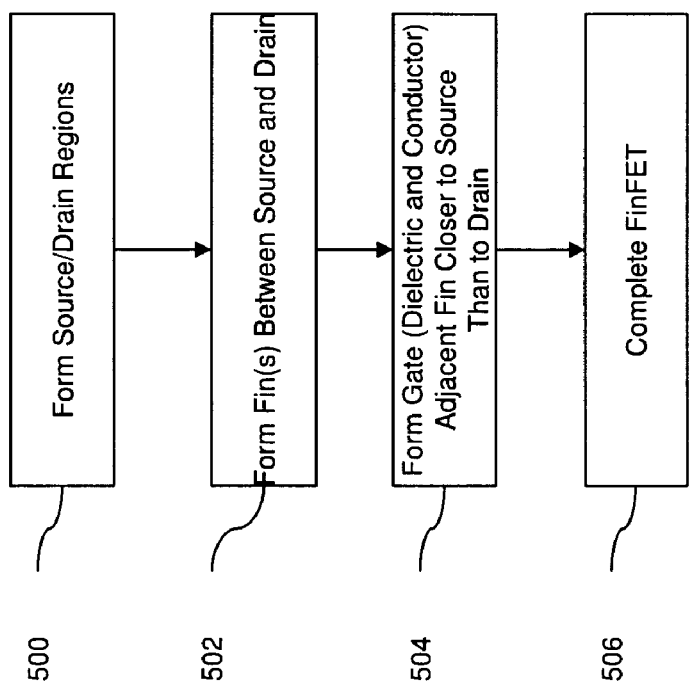
FIG. 5 is a schematic flow diagram illustrating a method of manufacturing the FinFET 100.

Referring to FIG. 5 in combination with FIG. 1, an embodiment of the method of manufacturing a fin-type field effect transistor, and particularly, an asymmetric FinFET 100 incorporates conventional silicon-on-insulator (SOI) FinFET processing techniques. The method comprises forming the source/drain regions 101, 102 (500) and forming the approximately 3-40 nm semiconductor fin 150 that extends from the source region 101 to the drain region 102 (502). Specifically, the source/drain regions and the fin can be lithographically patterned and etched into a silicon layer of an SOI wafer such that the source/drain regions are formed as parallel planes and the fin(s) extend between the source region and the drain region. Prior to etching, a hard mask may be deposited above the silicon layer.

Asymmetry is provided by forming a gate (e.g., gate dielectric layer and gate conductor 120) adjacent to the semiconductor fin 150 such that the gate conductor 120 is closer to the source region 101 than the drain region 102 (504). To form the gate a sacrificial oxide can be grown on the fin and, particularly, on the exposed silicon surfaces of the fin and the source/drain regions and then stripped to remove any irregularities. Then, a gate dielectric layer can be grown or deposited on the sidewalls and top surface of the fin. After forming the gate dielectric layer, a conductive material, such as a polysilicon, can be deposited over the fin, lithographically patterned and etched. In this embodiment, the gate conductor that is formed is positioned closer to the source region. The asymmetry in the placement of gate conductor 120 between the source and drain regions results a first resistance of the semiconductor fin 150 between the source region 101 and the gate conductor 120 that is less than a second resistance of the semiconductor fin 150 between the gate conductor 120 and the drain region 102. This asymmetry also results in a first capacitance between the source region 101 and the gate conductor 120 that is greater than a second capacitance between the gate conductor 120 and the drain region 102. Thus, forming the gate conductor 120 adjacent to the semiconductor fin 150 such that the gate conductor 120 is closer to the source region 101 than the drain region 102 decreases the resistance in the fin 150 between the source region 101 and the gate conductor 120 and decreases the capacitance between the gate conductor 120 and the drain region 102. Additional processing can performed to complete the FinFET 100 (506). This additional processing may include, but is not limited to: stripping the optional hard mask by a directional reactive ion etching process; implanting source/drain extensions (i.e., implanting sections of fin between gate conductor and the source/drain regions); forming halos; forming fin spacers; forming spacers on gate sidewalls; implanting N+ into the source/drain regions; forming a silicide layer (e.g., Co, Ni, Etc.) on the top surface of the fin, on the top surface of the source/drain regions, and/or on the top surface of the gate conductor if the gate conductor is formed with a polysilicon material and without a cap; depositing and planarizing an additional dielectric layer, forming gate contacts, forming source/drain contacts, etc. It should be noted that the same processing steps can be used to simultaneously form multiple transistors 100 in which multiple semiconductor fins share the same source/drain straps.

Figure 6:
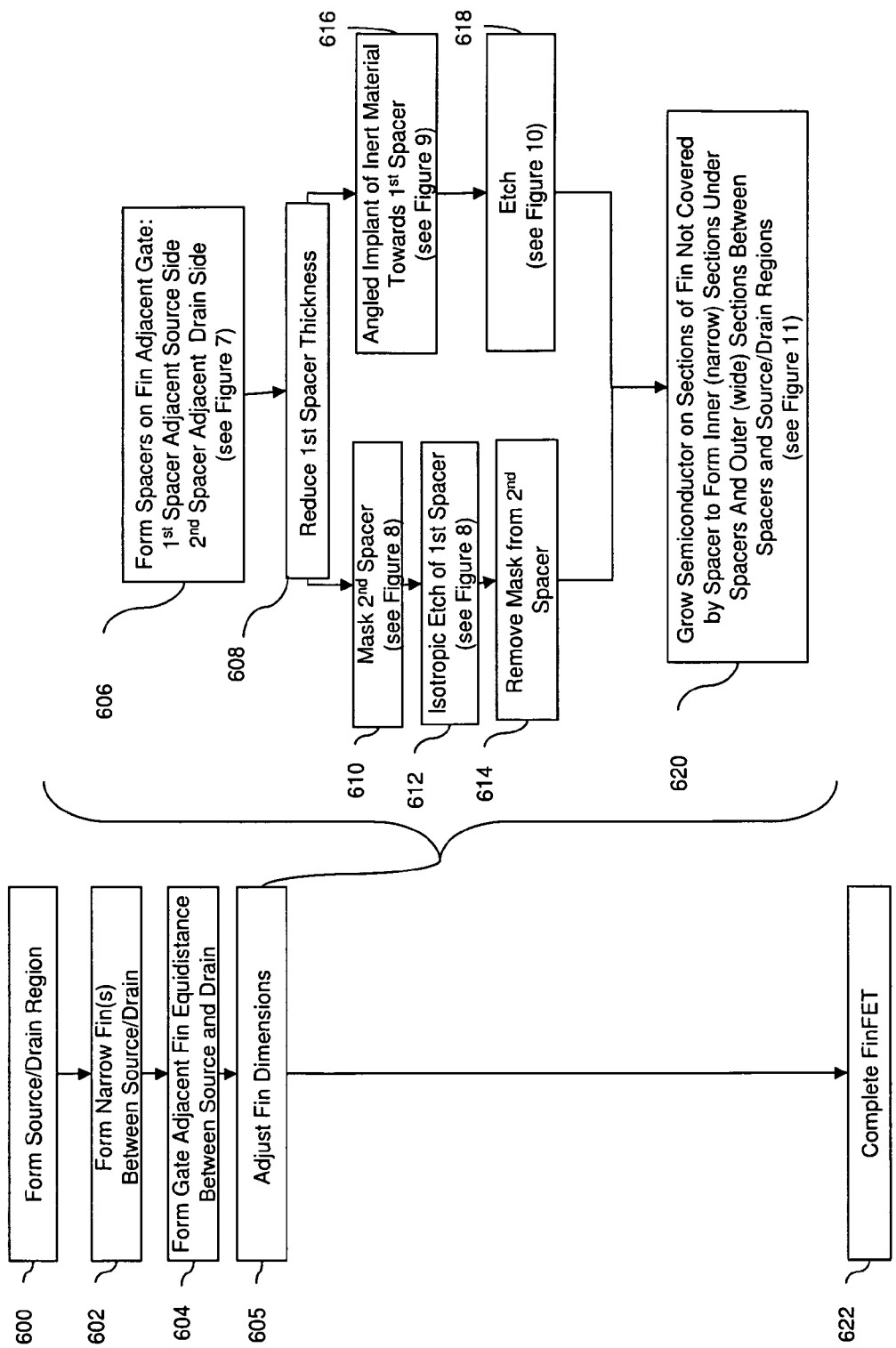
FIG. 6 is a schematic flow diagram illustrating a method of manufacturing the FinFET 200.

Referring to FIG. 6 in combination with FIG. 2, an alternative embodiment of the method of manufacturing an asymmetric FinFET 200 also incorporates conventional silicon-on-insulator (SOI) FinFET processing techniques. The method comprises forming the source/drain regions 201, 202 (600) and forming a narrow semiconductor fin 250 that extends from the source region 201 to the drain region 202 (602), as described in detail above. In this embodiment of the invention, however, the gate (including the gate conductor 220) can be formed adjacent the semiconductor fin 250 equidistance 283 between the source region 201 and the drain region 202 (604). After the gate is formed at process (604), the dimensions of the fin on either side of the gate conductor (e.g., between the gate conductor and the source region and between the gate conductor and the drain region) are adjusted to vary the first resistance within a first portion of the fin between the gate conductor and the source region and a second resistance of a second portion of the fin between the gate conductor and the drain region (605). Specifically, the dimensions of the first portion 251 can be adjusted so that a first inner section 261, having a first width 287 (e.g., 3-40 nm), is positioned adjacent to the gate conductor 220 and a first outer section 271, having a second width 288 that is greater than the first width 287, is positioned between the first inner section 261 and the source region 201. Similarly, the dimensions of the second portion 252 can be adjusted to form a second inner section 262 and a second outer section 272. The inner sections can each have the same width 287 and the outer sections can have the same width 288. Asymmetry can be achieved if the second inner section 262 is longer than the first inner section 262, thereby, decreasing the resistance in the fin 250 between the source region 201 and the gate conductor 220 and decreasing the capacitance between the gate conductor 220 and the drain region 201. Optimal asymmetry can be achieved if the first inner section 261 is formed with a first length 284 that is approximately equal to the first width 287 (e.g., 3-40 nm) and the second inner section 262 is formed with a second length 282 that is greater than approximately three to five times the first width 287 (e.g., 9-200 nm).

Figure 7:
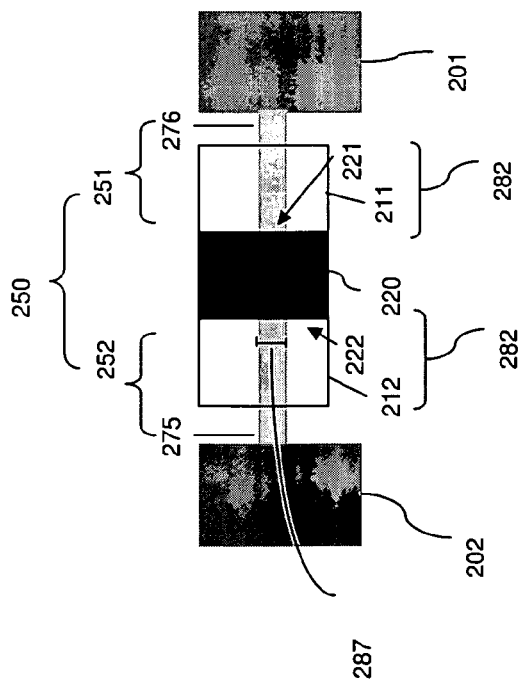
FIG. 7 is schematic diagrams of a partially completed FinFET 200.

In order to adjust the dimensions of the fin at process (605), as mentioned above, after forming the gate including the gate conductor 220 at process (604), first 211 and second 212 spacers are simultaneously formed immediately on the sides 221, 222 of the gate conductor 220 over the first portion 251 and second portion 252, respectively, of the fin 250 (606, see FIG. 7)). For example, the spacers 211, 212 may be formed by growing or depositing an approximately 9-200 nm thick silicon dioxide layer on the sides 221, 222 of the gate conductor 220. The spacers 211, 212 can initially be formed to have the same thickness 282. This thickness 282 should be greater than approximately three to five times the width 287 (i.e., first width) of the fin as originally formed (e.g., 3-40 nm). Thus, the spacers 211, 212 may each be approximately 9-200 nm thick. Additionally, the spacers 211, 212 should be formed such that a first exposed section 276 of the first portion 251 of the fin 250 remains between the first spacer 211 and the source region 201 and a second exposed section 275 of the second portion 252 of the fin 250 remains between the second spacer 212 and the drain region 202. After the spacers 211, 212 are formed at process (606), the size (i.e., thickness 282) of the first spacer 211 is reduced such that the spacer 211 has another thickness 284 that is approximately equal to the first width 287 (608, see FIG. 2). One technique for reducing the thickness of the first spacer comprises masking 277 the second spacer 212 (610, see FIG. 8) and then isotropically etching the first spacer (612, see FIG. 8). The etching process etches back not only the top surface 213 of the first spacer 211 but also the exposed sidewall 215 of the first spacer 211, thus, reducing the spacer thickness. Once the first spacer 211 thickness is reduced, the mask 277 is removed (614). Another technique for reducing the thickness of the first spacer comprises implanting an inert species 217 (e.g., silicon, argon, xenon, etc) into the silicon dioxide spacers 211, 212 from an angle 216 (<90 degrees) towards the first spacer 211 such that implantation of the second spacer 212 is shadowed (i.e., partially blocked) by the gate conductor 220. Thus, the first spacer 211 receives a greater concentration of the inert material 217 which enhances the etch rate of the first spacer 211 (616, see FIG. 9). Then, an etching process is performed such that first spacer 211 with the greater concentration of the inert species 217 is etched at a faster rate than the second spacer 212 (618, see FIG. 10). Again, the etching process (618) etches back not only the top surface 213 of the first spacer 211 but also the exposed sidewall 215 of the first spacer 211, thus, reducing the spacer thickness.

Figure 8:
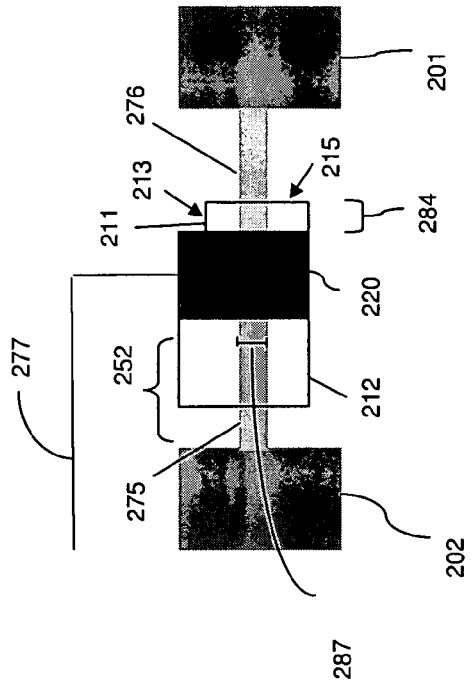
FIG. 8 is schematic diagrams of a partially completed FinFET 200.
Figure 9:
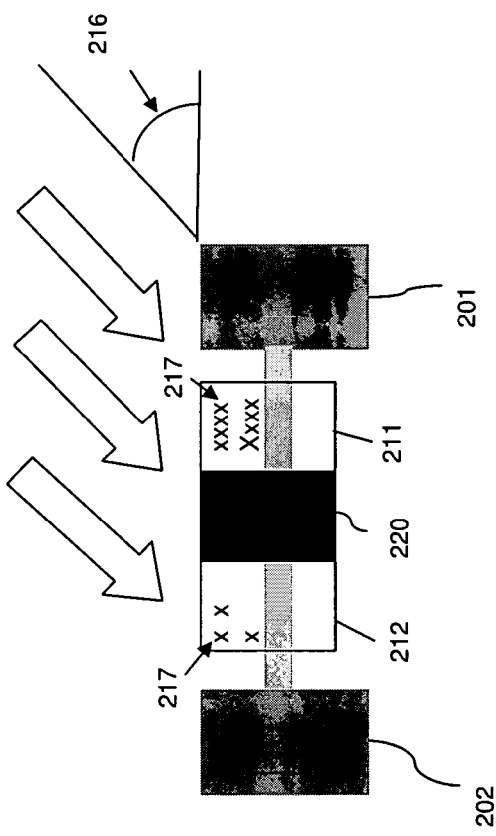
FIG. 9 is schematic diagrams of a partially completed FinFET 200.
Figure 10:
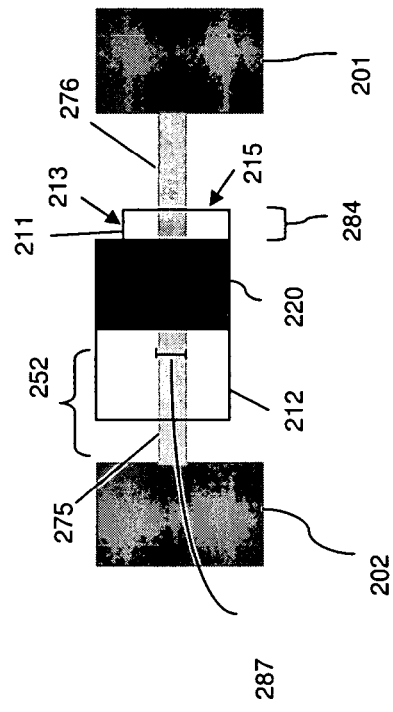
FIG. 10 is schematic diagrams of a partially completed FinFET 200.

Once the thickness of the first spacer 211 is reduced at process (608), additional semiconductor material (e.g., silicon, silicon germanium, silicon germanium carbide, etc.) is formed on the first 276 and second 275 exposed sections (620, e.g., see FIGS. 8 and 10). The process (620) of forming the additional semiconductor material can be accomplished by selectively growing silicon, silicon germanium, or silicon germanium carbide, on the exposed sections 275, 276 of the fin 250 as well as on the silicon source/drain regions. This process (620) forms the first and second outer sections 271, 272 (see FIG. 2). Thus, the first and second inner sections 261, 262 are those sections of the fin 250 that remain under the first 211 and second 212 spacers, respectively. Additional processing may be performed to complete the FinFET 200 (622 of FIG. 6), as described in detail above. It should be noted that the same processing steps can be used to simultaneously form multiple transistors 200 in which multiple semiconductor fins share the same source/drain straps.

Figure 11:
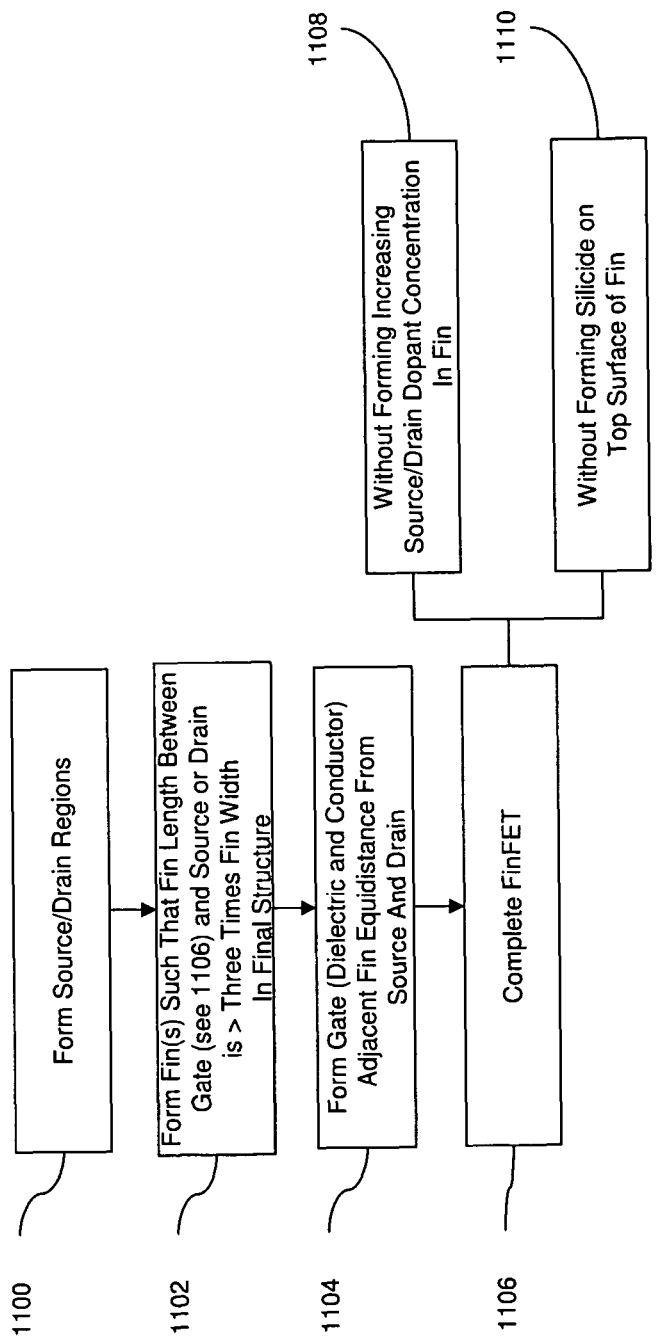
FIG. 11 is a schematic flow diagram illustrating a method of manufacturing the FinFET 300.

Referring to FIG. 11 in combination with FIG. 3a, an embodiment of the method of manufacturing a fin-type field effect transistor, and particularly, a ballasted FinFET 300 comprises forming the source/drain regions 301, 302 as well as forming the semiconductor fin 350 using conventional FinFET processing technology (1100-1102), as described in detail above. A gate, including a gate dielectric layer and a gate conductor 320, is formed adjacent to the semiconductor fin such that the gate conductor 320 is equidistance 383 between the source region 301 and the drain region 302 (1104, see detail description of gate formation process above). Ballasting can be achieved by forming the gate such that the length 383 of the fin 350 between either the gate conductor 320 and the source region 301 or the gate conductor 320 and the drain region 302 is greater than approximately three times a width 388 of the semiconductor fin 350. This length 383 provides added resistance within the semiconductor fin 350 so that the transistor 300 is operable at a predetermined maximum voltage. Once the source/drain regions 301, 302, fin 350, and gate, including the gate conductor 320, are formed additional processing steps may be performed to complete FinFET (1106, see detailed description above). Additional resistance for ballasting can be provided by forming the semiconductor fin 350 with a lesser concentration of source/drain dopants than the source/drain regions (1108) (e.g., by blocking implantation of an N+region 392 into the fin 350 at process 1106, see FIG. 3b) and without a silicide layer on the top surface 395 of the fin 350 (1110) (e.g., by blocking formation of the silicide layer 391 on the top surface 395 of the fin 350 at process 1106, see FIG. 3b). It should be noted that the same processing steps can be used to simultaneously form multiple transistors 300 in which multiple semiconductor fins share the same source/drain straps (see FIG. 3c).

Figure 12:
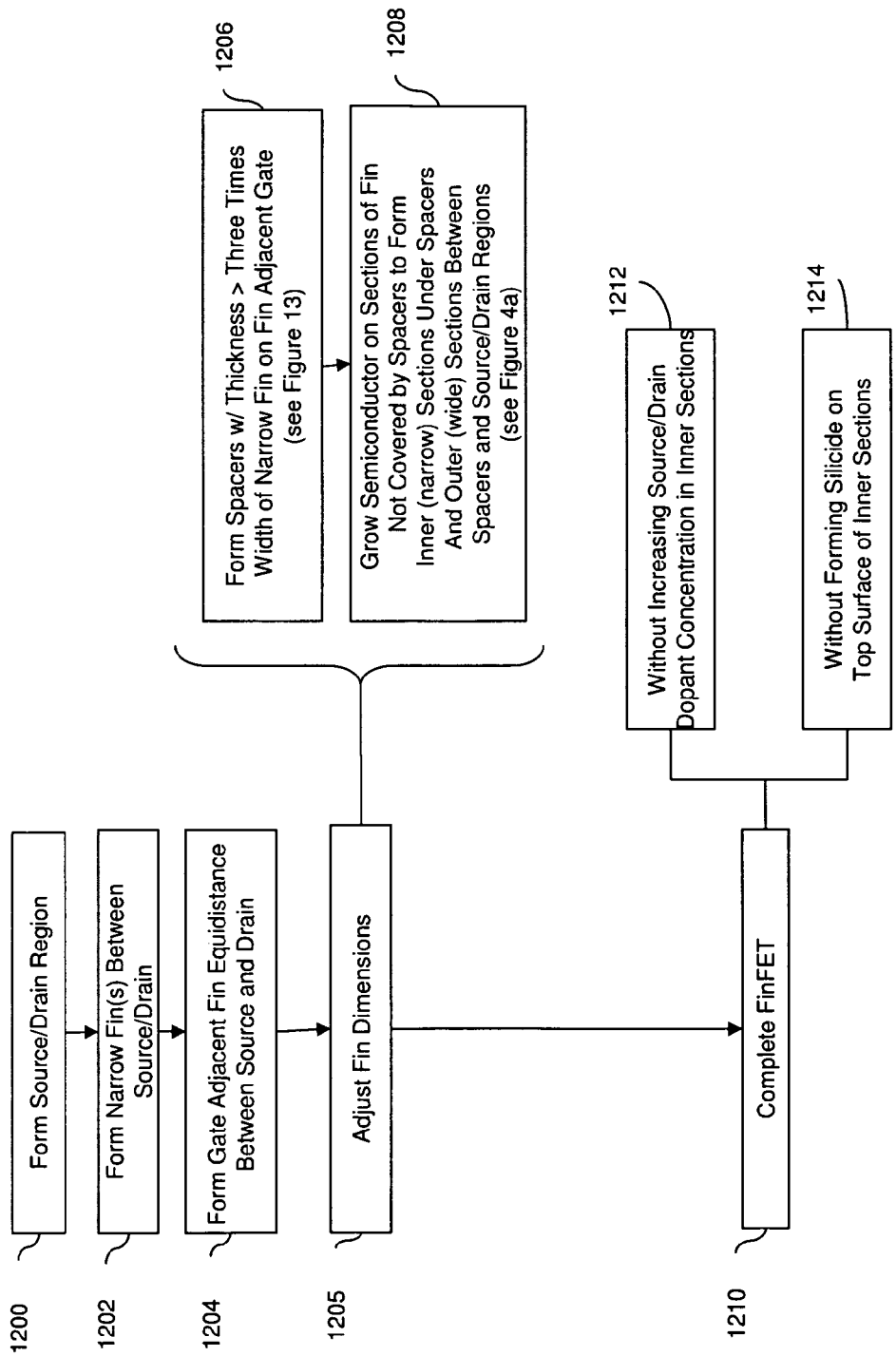
FIG. 12 is a schematic flow diagram illustrating a method of manufacturing the FinFET 400.

Alternatively, referring to FIG. 12 and FIG. 4a in combination, an embodiment of the method of manufacturing the ballasted FinFET 400 comprises forming the source/drain regions 401, 402 as well as forming a narrow semiconductor fin 450 using conventional FinFET processing technology (1200-1202, see detailed description above). A gate, including a gate dielectric layer and a gate conductor 420, is formed adjacent to the semiconductor fin 450 such that the gate conductor 420 is equidistance 483 between the source region 401 and the drain region 402 (1204, see detailed description above). After the formation of the gate at process (1204), the dimensions of the fin can be adjusted to optimize resistance so that the transistor is operable at a predetermined maximum voltage (1205). The dimensions of the fins may be adjusted by forming outer sections of the fin adjacent to the source/drain that are wider than inner sections of the fin adjacent to the gate conductor. Specifically, the dimensions of both a first portion 451 of the fin 450 not covered by the gate conductor 420 that extends between the source region 401 and the gate conductor 420 and a second portion 452 that extends between the gate conductor 420 and the drain region 402 can adjusted. The dimensions can be adjusted so that inner sections 461, 462 that have the same width 487 (i.e., a first width 487) and the same length (i.e., first length 482) are positioned adjacent the gate conductor. Additionally, the dimensions can be adjusted so that outer sections 471, 472 have the same width 488 (i.e., second width) and the same length 481 (i.e., second length) and are positioned adjacent the source/drain regions. The outer sections 471, 472 are formed such that their width 488 is greater than the width 487 of the inner sections 461, 462. Ballasting is achieved by forming the inner and outer sections so that the length 482 of the inner sections 461, 462 is greater than approximately three times the original width of the fin (i.e., first width 487), thereby, providing enough resistance within the first and second inner sections 461, 462 so that the transistor 400 is operable at a predetermined maximum voltage.

Figure 13:
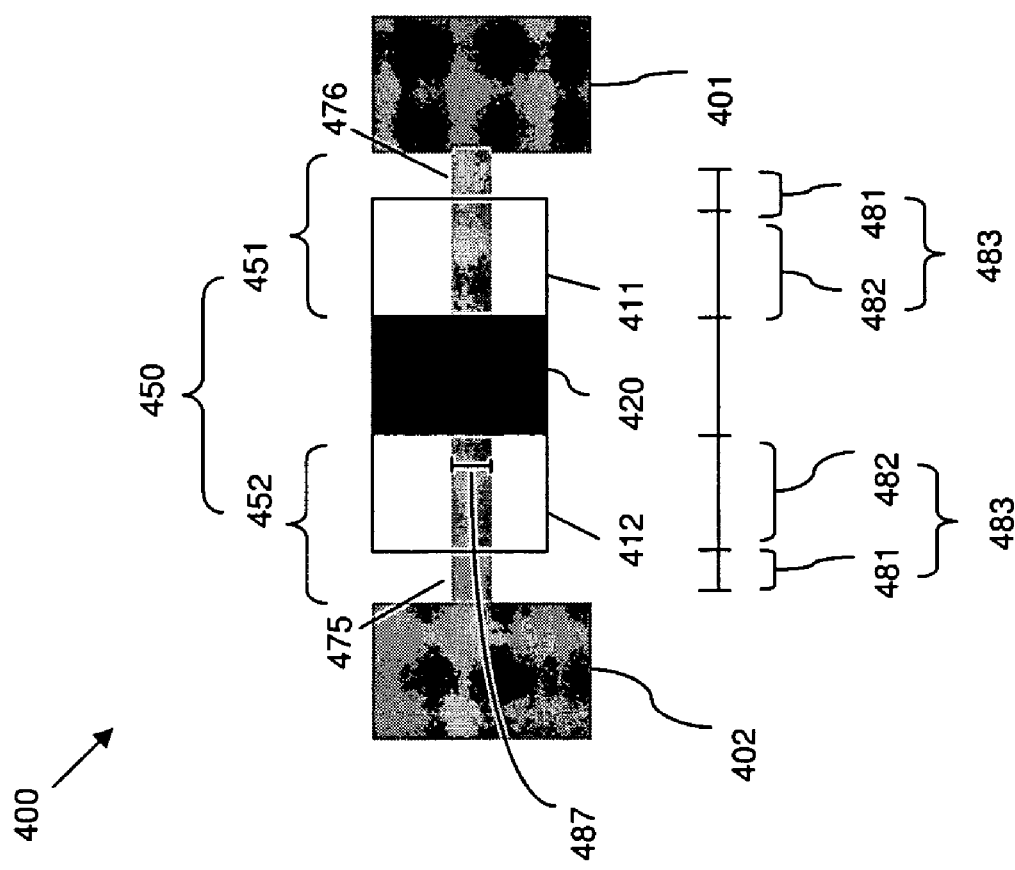
FIG. 13 is schematic diagrams of a partially completed FinFET 400.

In order to adjust the dimensions of the fin at process (1205) to form the inner sections 461, 462 and the outer sections 471, 472, as described above, spacers 411, 412 are formed over the first and second portions 451, 452 of the fin 450 (e.g., on the top surface and opposing sidewalls of the fin 450) immediately adjacent the sides 421, 422 of the gate conductor 420 (1206, see FIG. 13). The spacers 411, 412 can be formed (e.g., by growing or depositing a silicon dioxide) with a thickness 482 that is greater than approximately three to five times the first width 487 (i.e., the width of the fin (e.g., 3-40 nm) as initially formed at process (1202)). The spacers should also be formed such that first and second exposed sections 476, 475 of the fin 450 remain between the spacers 411, 412 and the source/drain regions 401, 402. Once the spacers 411, 412 are formed, additional semiconductor material (e.g., silicon, silicon germanium, silicon germanium carbide, etc.) is formed on the exposed sections 475, 476 of the fin to form the first and second outer sections 471, 472 (1208, see FIG. 4a). Thus, the first and second inner sections 461, 462 are those sections of the fin 450 that remain under the spacers 411, 412. The length of the inner sections is a function of the thickness of the spacers. Again, once the source/drain regions 401, 402, fin 450, and gate, including the gate conductor 420, are formed additional processing steps may be performed to complete FinFET (1210), as described in detail above. Additional resistance for ballasting can be provided by forming the first and second inner sections 461, 462 of the semiconductor fin 450 with a source/drain dopant concentration that is less than that of the source/drain regions (1212) (e.g., by blocking implantation of an N+region 492 into the fin 450 at process 1210, see FIG. 4b) and by forming the inner sections without a silicide layer (1214) (e.g., by blocking formation of the silicide layer 491 on the top surface 495 of the fin 450 at process 1210, see FIG. 4b). It should be noted that the same processing steps can be used to simultaneously form multiple transistors 400 in which multiple semiconductor fins share the same source/drain straps (see FIG. 4c).

Therefore, disclosed above are an improved fin-type field effect transistor (FinFET) structure and the associated methods of manufacturing the structure. In one embodiment FinFET drive current is optimized by configuring the FinFET asymmetrically to decrease fin resistance between the gate and the source region and to decrease capacitance between the gate and the drain region. Due to this simultaneously low source-gate resistance and low drain-gate capacitance, such asymmetric FinFETS can provide circuits having higher switching speed and reduced power. This also translates into physically smaller circuits, and hence lower cost circuits, since fewer fins can provide equivalent speed. In another embodiment device destruction at high voltages is prevented by ballasting the FinFET. Specifically, resistance is optimized in the fin between the gate and both the source and drain regions (e.g., by increasing fin length, by blocking source/drain implant from the fin, and by blocking silicide formation on the top surface of the fin) so that the FinFET is operable at a predetermined maximum voltage. Such ballasted FinFETs provide for higher reliability at higher operation voltage, and can avoid special, costly processing steps otherwise required to add special high-voltage transistors to a circuit. While the invention has been described in terms of embodiments, those skilled in the art will recognize that the invention can be practiced with modification within the spirit and scope of the appended claims.

What is claimed is:

1. A fin-type field effect transistor comprising:
   a source region comprising a first semiconductor plane having a first length;
   a drain region comprising a second semiconductor plane parallel to said first semiconductor plane and having a second length;
   a semiconductor fin, having a first end and a second end opposite said first end, said semiconductor fin extending from said first semiconductor plane at said first end to said second semiconductor plane at said second end and being essentially perpendicular to said first semiconductor plane and said second semiconductor plane, said semiconductor fin further having a width that is less than said first length and said second length; and
   a gate conductor adjacent said semiconductor fin between said source region and said drain region at a predetermined position closer to said source region than said drain region such that a first resistance of said semiconductor fin between said source region and said gate conductor is less than a second resistance of said semiconductor fin between said gate conductor and said drain region, and such that a first capacitance between said source region and said gate conductor is greater than a second capacitance between said gate conductor and said drain region.

2. The transistor of claim 1, said semiconductor fin further comprising source/drain extension regions extending laterally between said gate conductor and said source region and between said gate conductor and said drain region.

3. The transistor of claim 1, further comprising a plurality of additional semiconductor fins parallel to said semiconductor fin and extending from said first semiconductor plane to said second semiconductor plane, said gate conductor further being adjacent to said additional semiconductor fins between said source region and said drain region at said predetermined position closer to said source region.

4. A fin-type field effect transistor comprising:
   a source region having a first top surface and a first length;
   a drain region parallel to said source region and having a second top surface and a second length;
   a silicide layer covering said first top surface of said source region and said second top surface of said drain region;
   a semiconductor fin extending between said source region and said drain region, said semiconductor fin having a width that is less than said first length and said second length;
   a gate conductor adjacent to a center portion of said semiconductor fin between said source region and said drain region; and
   gate sidewall spacers on opposing sides of said gate conductor,
   said semiconductor fin extending laterally beyond said gate sidewall spacers such that said source region and said drain region are physically separated from said gate sidewall spacers, and
   said semiconductor fin further comprising:
      a first end portion extending laterally between said source region and one of said gate sidewall spacers, said first end portion being unsilicided, and
      a second end portion extending laterally between said drain region and another one of said gate sidewall spacers, said second end portion being unsilicided.

5. The transistor of claim 4, said first end portion and said second end portion each having a same predetermined width and a same predetermined length sufficient to provide at least a minimum amount of resistance required to enable said transistor to be operable at a predetermined maximum voltage.

6. The transistor of claim 5, said same predetermined length being at least three times greater than said same predetermined width.

7. The transistor of claim 4, further comprising dopants having a same conductivity type in said source region, in said drain region and in said first end portion and said second end portion of said semiconductor fin, wherein a concentration of said dopants in said source region and said drain region is higher than a concentration of said dopants in said first end portion and said second end portion of said semiconductor fin.

8. The transistor of claim 4, further comprising a plurality of additional semiconductor fins between said source region and said drain region.

9. The transistor of claim 4, said semiconductor fin further comprising source/drain extension regions extending laterally between said gate conductor and said source region and between said gate conductor and said drain region.

10. A fin-type field effect transistor comprising:
    a source region having a first top surface and a first length;
    a drain region having a second top surface and a second length;
    a silicide layer covering said first top surface of said source region and said second top surface of said drain region;
    a plurality of semiconductor fins extending between said source region and said drain region;
    a gate conductor adjacent to a center portion of each of said semiconductor fins between said source region and said drain region; and
    gate sidewall spacers adjacent to opposing sidewalls of said gate conductor, each of said semiconductor fins extending laterally beyond said gate sidewall spacers such that said source region and said drain region are physically separated from said gate sidewall spacers, and each of said semiconductor fins further comprising:
- a first end portion extending laterally between said source region and one of said gate sidewall spacers, said first end portion being unsilicided, and
- a second end portion extending laterally between said drain region and another one of said gate sidewall spacers, said second end portion being unsilicided.

11. The transistor of claim 10, said first end portion and said second end portion of each of said semiconductor fins each having a same predetermined width and a same predetermined length sufficient to provide at least a minimum amount of resistance required to both avoid current run-away and enable said transistor to be operable at a predetermined maximum voltage.

12. The transistor of claim 11, said same predetermined length being at least three times greater than said same predetermined width.

13. The transistor of claim 10, further comprising dopants having a same conductivity type in said source region, in said drain region and in said first end portion and said second end portion of each of said semiconductor fins, wherein a concentration of said dopants in said source region and said drain region is higher than a concentration of said dopants in said first end portion and said second end portion of said semiconductor fins.

* * * * *